United States Patent
Pita et al.

(10) Patent No.: US 7,087,498 B2
(45) Date of Patent: Aug. 8, 2006

(54) METHOD FOR CONTROLLING TRENCH DEPTH IN SHALLOW TRENCH ISOLATION FEATURES

(75) Inventors: Mario Pita, Winter Springs, FL (US); Milton Beachy, Kissimmee, FL (US); Gerald W. Gibson, Jr., Danbury, CT (US)

(73) Assignee: Agere Systems Inc., Allentown, PA (US)

( * ) Notice: Subject to any disclaimer, the term of this patent is extended or adjusted under 35 U.S.C. 154(b) by 309 days.

(21) Appl. No.: 10/675,259

(22) Filed: Sep. 30, 2003

(65) Prior Publication Data

US 2005/0070112 A1    Mar. 31, 2005

(51) Int. Cl.
*H01L 21/302* (2006.01)

(52) U.S. Cl. .................... 438/359; 438/8; 438/16; 438/700; 438/714; 438/736; 216/59

(58) Field of Classification Search ............... 216/59, 216/79, 84, 99; 438/5, 7, 8, 14, 16, 298, 438/359, 700, 714, 736
See application file for complete search history.

(56) References Cited

U.S. PATENT DOCUMENTS

| | | | |
|---|---|---|---|
| 5,229,316 A | | 7/1993 | Lee et al. |
| 5,413,966 A | | 5/1995 | Schoenborn |
| 6,207,576 B1 | | 3/2001 | Wang et al. |
| 6,277,710 B1 | | 8/2001 | Kim et al. |
| 6,281,068 B1 | | 8/2001 | Coronel et al. |
| 6,300,251 B1 | * | 10/2001 | Pradeep et al. ............. 438/710 |
| 6,348,389 B1 | | 2/2002 | Chou et al. |
| 6,426,298 B1 | | 7/2002 | Chen et al. |
| 6,444,581 B1 | | 9/2002 | Buschner et al. |
| 6,582,974 B1 | | 6/2003 | Lui et al. |
| 2004/0084409 A1 | * | 5/2004 | Deshmukh et al. ........... 216/63 |

\* cited by examiner

*Primary Examiner*—George A. Goudreau (57) ABSTRACT

A method for forming a trench in a semiconductor silicon substrate. An anti-reflective coating layer and a photoresist layer are formed over the substrate and patterned in accordance with a location for the trench. During the trench etch into the silicon substrate, the etch environment is monitored to detect the material of the anti-reflective coating layer. The etch process is controlled in response to detecting the removal of this material and the known etch rate differential between the anti-reflective coating material layer and the silicon substrate.

22 Claims, 4 Drawing Sheets

METHOD FOR CONTROLLING TRENCH DEPTH IN SHALLOW TRENCH ISOLATION FEATURES

FIELD OF THE INVENTION

This invention relates generally to the isolation of semiconductor device regions, and more specifically to a method for forming shallow trench isolation structures.

BACKGROUND OF THE INVENTION

Integrated circuits (or chips) typically comprise a silicon substrate and semiconductor devices, such as transistors, formed from doped regions within the substrate. Interconnect structures, formed in parallel layers overlying the semiconductor substrate and interconnected by vertical conductive vias, provide electrical connection between semiconductor device regions to form electrical circuits.

During the formation of integrated circuits, it is frequently necessary to remove regions of the top layer or layers of a wafer surface. Etching is one process employed to accomplish this material removal. To designate a region to be etched, a thin photoresist material layer is deposited over a wafer surface and patterned by exposing certain regions of the photoresist layer to a controlled pattern of radiation through a mask layer comprising transparent and opaque regions. The radiation passing through the transparent regions causes a chemical reaction in the exposed regions of the photoresist. Visible light, ultraviolet radiation, electron beam energy, or x-ray energy may be used as the developing radiation depending upon the photoresist material selected. A developer is applied to the photoresist layer to dissolve and remove either the radiation exposed areas or the radiation-shielded areas, depending upon the chemistry of the photoresist material.

In either case, a desired region of the underlying substrate is uncovered for exposure to subsequent etching steps through the opening in the photoresist layer, while the regions that remain covered by the photoresist are shielded from subsequent etching steps. If the radiation-exposed areas become less soluble in the developer solution, the non-exposed areas are removed and the pattern remaining on the substrate is a negative image of the pattern of radiation, therefore referred to as a negative photoresist. If the radiation-exposed area becomes more soluble in the developer solution, the pattern remaining on the substrate is a positive image of the pattern of radiation, therefore referred to as a positive photoresist.

Generally, etching processes fall into two categories, wet etching and dry etching. According to a wet etch chemistry, the structure is immersed in or exposed to a liquid chemical bath containing an etchant solution, for example a buffered HF solution. The region to be removed contacts the etchant through the patterned photoresist. Etchants are further subdivided into two broad categories, referred to as isotropic etchants and anisotropic etchants. For the most part, wet etchants tend to be isotropic and dry etchants tend to be anisotropic. Isotropic etchants, which are available for silicon dioxide, nitrides, aluminum, polysilicon, gold, and silicon, attack the material at substantially the same rate in all directions, removing material vertically through the photolithographic etch mask and horizontally under the etch mask. In some applications, significant undesirable horizontal etching, referred to as undercutting, can occur during the isotropic etch process. Anisotropic etchants attack the material layers at different rates in different directions and thus provide more control over the directional aspects of the material removal process. Dry etching uses a gas as the primary etch agent, etching the wafers without the use of wet chemicals or the requirement for rinsing steps after the etch process has been completed.

In addition to geometric selectivity, etchants are also material selective. That is, a specific etch chemistry etches different materials at different etch rates. For example, hydrofluoric acid (HF) etches silicon dioxide but does not effectively etch silicon.

Like all fabrication process steps employed in the manufacture of integrated circuits, the etching process must be carefully controlled to ensure that the electrical and mechanical properties of the resulting semiconductor devices are within their specified parametric range. One important aspect of the etching process is end-point control, i.e., controlling the etch duration by terminating the etch at the appropriate time. Typically, end point control is achieved by choosing an etch chemistry that selectively attacks and removes one or more material layers, without affecting adjacent layers. Positioning an etch-stop layer below the material layer to be removed drastically slows the etch process when the etchant reaches the etch-stop layer. When material of the etch-stop layer is detected in the etch chamber environment, the etch process is terminated.

Figure 1:
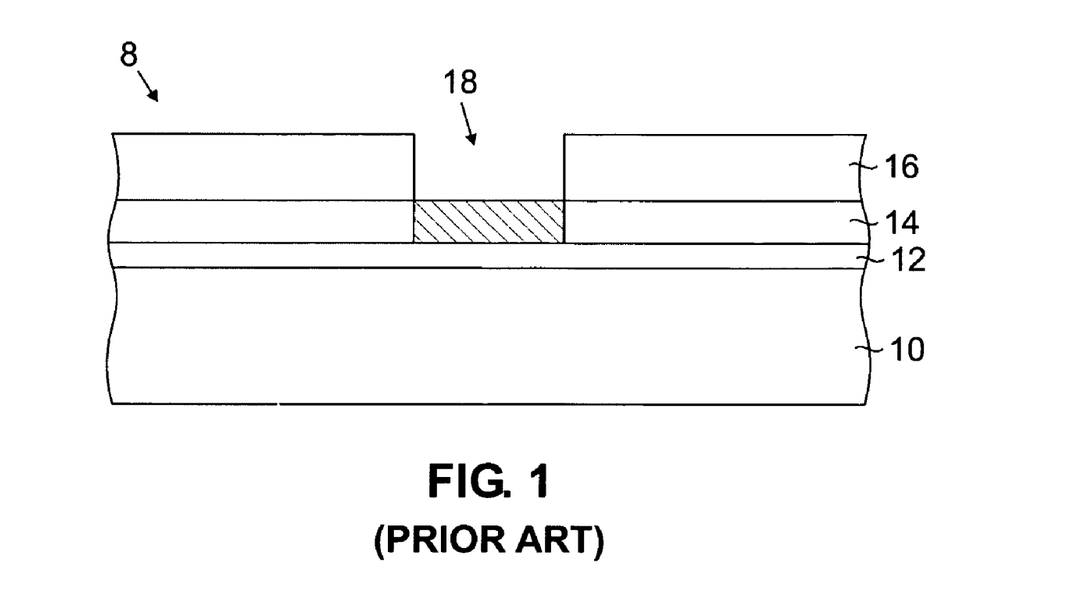
FIGS. 1 and 2 are cross-sectional views of a prior art technique for forming a trench in integrated circuit material layers.

An exemplary etch process for a semiconductor wafer is illustrated beginning in FIG. 1, depicting a stack 8 comprising in stacked relation, a substrate 10, an etch-stop layer 12, a material layer 14, and a photoresist layer 16. The photoresist layer 16 is patterned as described above to form an opening 18 therein. The stack 8 is exposed to an etchant to remove a region 19 of the material layer 14.

The etch process for removing the region 19 is terminated when the material of the etch-stop layer 12 is detected in the etch chamber. Etching according to this process is referred to as an end-point mode etch. In one embodiment the etch-stop layer 12 comprises silicon nitride. Detection of the etch-stop material is accomplished by sensing an increase in the concentration of nitrogen (for the silicon-nitride etch-stop layer) present in the etch chamber environment, thus indicating that the etch process has reached the etch-stop layer 12. At this point the etch process is terminated as the region 19 of the material layer 14 has been completely removed, forming a opening 20 in the material layer 14. Ideally, there has been no etching of the substrate 10. See FIG. 2. After the etch process is complete, the photoresist layer 16 is removed and the wafer is ready for the next process step.

Figure 2:
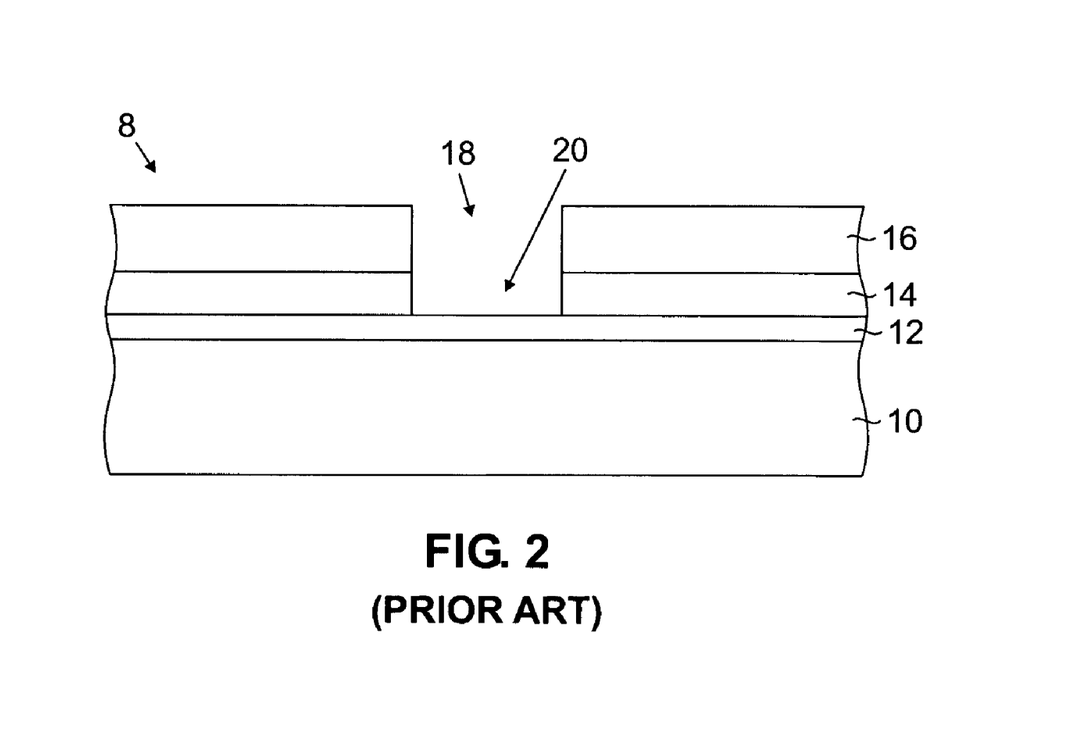
Figure 3:
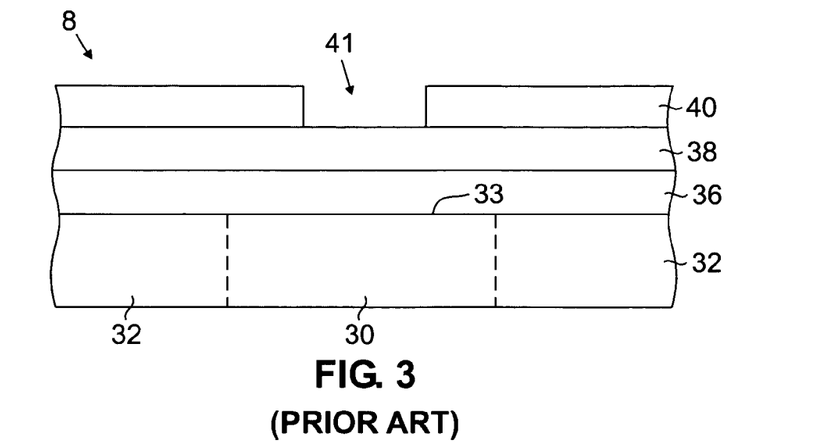
FIGS. 3–6 are cross-sectional views illustrating the formation of a shallow trench isolation feature according to the prior art.

The end-point material of the etch-stop layer can be detected in the etch chamber using various techniques known in the art, including: ellipsometry, reflectometry, interferometry, and emissivity measurements. In an embodiment where the etch-stop layer 12 comprises silicon dioxide, removal of the material layer 14 can be detected by an increased intensity of the light emitted by the etch by-product carbon monoxide as the etch reactive gasses interact with the etch-stop layer 12.

If, for example, the material layer 14 comprises silicon nitride and the etch chemistry includes fluorocarbons (e.g., $CF_4$, $CHF_3$ and $C_2F_6$), cyanide (CN) is produced as a plasma etch by product. The CN reacts with the plasma gasses to produce a spectral component at about 3700 Angstroms. A decrease in the intensity of this spectral component indicates that the etching of the silicon nitride material layer 14 is substantially complete.

Etch chambers can also be equipped with a timer mechanism for triggering an etch stop. An expected etch duration time limit is determined based on the material layer to be removed and the etch process parameters. From the expected duration, low and high time limits are calculated. If the etch process time reaches the low or the high limit prior to detecting the etch-stop material, the etch process is automatically terminated. Use of the timer ensures real time identification of a malfunctioning etch chamber.

In certain etch processes the etching is not necessarily terminated immediately at the end point. Since the etchant may not be distributed uniformly over the wafer, the etch is extended by an over-etch duration to ensure that all regions are removed as intended. Also, the etchant may remove small regions faster than large regions, also necessitating an over-etch period.

Certain etch processes utilize a hard mask in lieu of the photoresist mask formed in the photoresist layer 16 described above. In an exemplary hard mask process a silicon dioxide or silicon nitride layer (not shown in FIGS. 1 or 2) is formed overlying the etch-stop layer 12, for use as a hard mask through which an underlying layer or layers are etched. According to the hard mask process, the photoresist layer 16 is applied over the silicon dioxide layer and the former is patterned as described above. The pattern is then transferred from the photoresist layer 16 to the hard mask layer by etching the hard mask according to the pattern in the photoresist layer 16. The hard mask etch process stops on the etch-stop layer 12. The photoresist layer 16 is removed and the etching steps to form the opening 20 in the material layer 14 are performed using the patterned hard mask layer. This process advantageously offers better dimensional control of the etched features than the standard photoresist etch process.

Within an integrated circuit substrate it may be necessary to isolate certain doped regions to avoid the effects of parasitic devices that are formed as the device doped regions are formed. In particular, in a CMOS (complimentary metal-oxide semiconductor) device proximate n-channel and p-channel devices formed in oppositely-doped wells, lead to the inadvertent formation of parasitic bipolar structures, such as a p-n-p-n thyristor. Although this thyristor operation is inefficient, under certain bias conditions, the p-n-p portion of the structure can supply base current to the n-p-n portion of the structure causing a large current to flow, leading to latch-up of the CMOS device.

Several techniques have been developed for electrically isolating devices to avoid these parasitic effects. One common isolation technique is a local oxidation of silicon (LOCOS) process. LOCOS isolation involves the formation of recessed silicon dioxide material region in a non-active region (also referred to as a field region) of a semiconductor substrate between the p-channel and n-channel devices. According to the conventional LOCOS process, a thin layer of silicon nitride is deposited over the substrate and patterned according to conventional, masking, patterning and etching steps. The isolating silicon dioxide regions are formed by oxidation of the underling silicon in the substrate regions exposed through openings in the silicon nitride, while no oxidation occurs in the in the masked regions.

When LOCOS isolation is employed in the formation of metal-oxide field effect transistors (MOSFETs) in a CMOS circuit, a step is formed between a gate oxide of each MOSFET and a field oxide that forms the LOCOS region. This step, which is about 1500 Angstroms, is generally considered too large to permit accurate photolithographic patterning of device features during subsequent processing steps, especially for devices having a gate thickness of about 0.25 um and smaller. Thus other process steps may be employed to avoid the effects of this oxide step.

Another disadvantage associated with the LOCOS process is the formation of a bird's beak under the silicon nitride layer. At the edges of the silicon nitride masking layer, the silicon dioxide can extend under and lift an edge of the silicon nitride layer. The shape of the LOCOS silicon dioxide at the silicon nitride edge is a gradually tapering wedge, which resembles and is therefore referred to as a bird's beak. In addition to lifting the silicon nitride mask, the bird's beak can also encroach into active regions of the semiconductor device.

Shallow trench isolation (STI) is another known isolation technique that eliminates both the gate oxide-to-field oxide step and the bird's beak. STI uses dielectric filled trenches in the substrate to separate or isolate the semiconductor devices, including CMOS devices and bipolar transistors. STI is an important technology for device sizes of 0.25 microns and below, providing isolation in a smaller surface area and with a flatter upper surface topology than the LOCOS technique.

FIGS. 3–6 are cross-sectional views illustrating the formation of a shallow trench isolation feature according to the prior art. A semiconductor substrate 30 comprises active devices formed within regions depicted generally by a reference character 32. It is desired to isolate these devices with a shallow trench. A plurality of material layers, disposed on an upper surface 33 of the substrate 30, comprise a stress-reducing silicon dioxide layer 36 (also referred to as a pad oxide), a silicon nitride layer 38, and a photoresist layer 40. The photoresist layer 40 is patterned using a mask as described above, to form an opening 41 therein. Using the photoresist layer 40 as an etch mask, a trench 46 (see FIG. 4) is etched in the silicon nitride layer 38, the silicon dioxide layer 36, and through an upper portion of the substrate 30.

Figure 6:
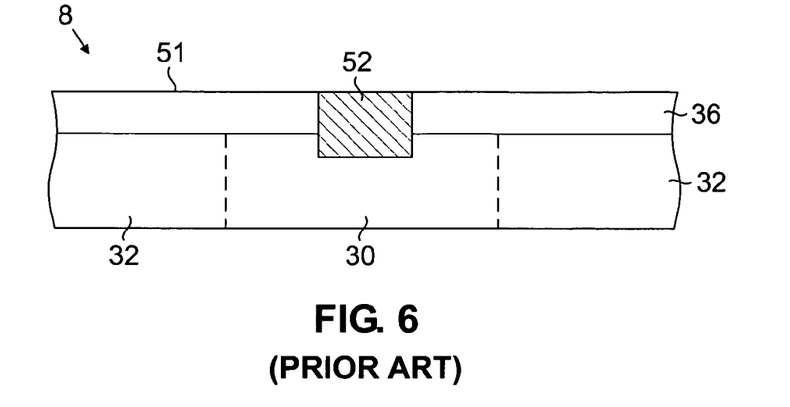

The photoresist layer 40 and the silicon nitride layer 38 are removed, and a trench oxide layer 50 is formed or deposited in the trench 46 and on an upper surface 51 of the silicon dioxide layer 36. See FIG. 5. A chemical mechanical polishing step planarizes the upper surface 51, leaving the trench oxide material 50 within the trench 46 and planar with the upper surface 51, forming a shallow trench isolation structure 52 as illustrated in FIG. 6. When the STI process is employed in the formation of CMOS devices the upper surface 51 is substantially planar with an upper surface of the gate oxide layer (also referred to as the thin oxide region), not shown in FIG. 6. Thus the relatively large step that would be formed according to a LOCOS isolation process is absent.

Figure 4:
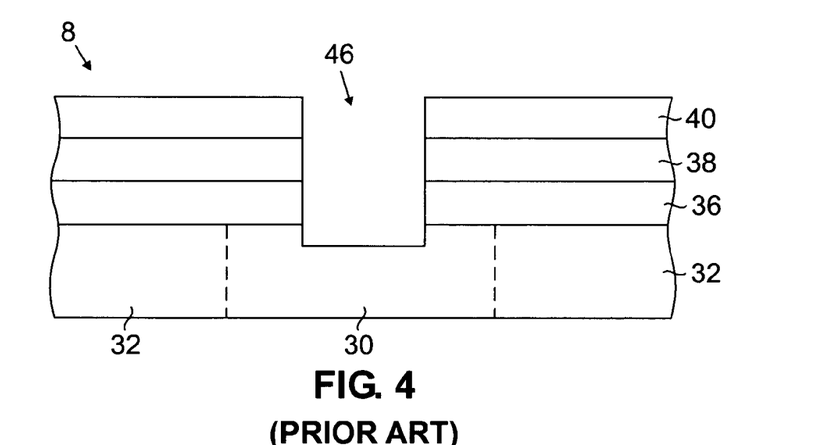
Figure 5:
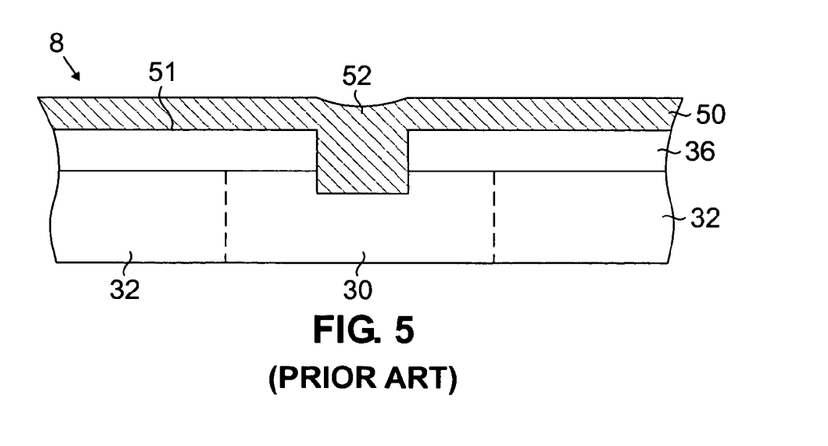

The shallow trench isolation technique requires less area on the substrate surface, as compared with the LOCOS process. Thus the circuit designer can include more transistors per unit area than in designs using LOCOS isolation. STI also provides superior isolation because the sharp corners at the bottom of the trench 46 create voltage barriers that block leakage currents between adjacent semiconductor devices. LOCOS regions generally present rounded corners. Also, the bird's beak is not formed according to the STI process. STI trenches are typically about 3000 Angstroms deep.

One disadvantage associated with the use of shallow trench isolation is the lack of a suitably accurate mechanism for etch end-point detection, i.e., determining when the etch has formed a trench of the desired depth in the substrate 36. Typically, an etch duration is calculated based on the desired trench depth, the material to be etched, the etch chemistry and other known etch process parameters. During the etch process the etch elapsed time is monitored and the etch terminated when the elapsed time reaches the predetermined etch duration. It is known, however, that use of the elapsed time to control the etch duration may not produce repeatable trench depths due to temporal variations in the etch process parameters.

To form trenches of equal depth from wafer-to-wafer (e.g., using a single wafer etcher) or from batch-to-batch (e.g., using a batch reactor), the etch process parameters that affect the etch rate must be carefully monitored and controlled. Off-line metrology tools are used to periodically measure the depth to determine if the process is producing repeatable trench depths that are within a specified range of the desired depth. After processing each cassette of wafers (typically 25 wafers) or at the beginning of each day, the etch depth is measured using a profilometer on an active device wafer in a test structure. If found to be out of specification, the process variables are examined to determine the cause of the anomaly and the process recipe is modified in response thereto.

Several factors can influence the etch rate and thus the trench depth. For example, for a plasma etch process, the RF power supply may have drifted from its required value, thus affecting the etch rate. The mass flow controller that controls the flow of process gas into the etch chamber may not be properly calibrated. The conditions of the etch chamber (e.g., the time interval since the last chamber clean and the type of material etched during the last etch process) can also influence the etch rate.

These etch rate control techniques provide trench depth information for controlling the fabrication process, but they may not provide the desired repeatability and accuracy for trench depth. Nor do they provide real-time control over the etch rate, as the critical measurements are performed off-line and process modifications are initiated only after confirming an out-of-specification trench condition. This is a time-consuming process, resulting in extended fabrication cycles. There is also the cost of the wafer etch rate monitoring equipment to be considered. Finally, if the chamber etch rate drifts between daily or batch measurements, there is a substantial risk of producing defective wafers.

BRIEF SUMMARY OF THE INVENTION

A method for etching a trench in a semiconductor silicon substrate, wherein the etch process is performed in an etch chamber. The method comprises forming a mask layer and forming an anti-reflective coating layer overlying the mask layer. The mask layer and the anti-reflective coating layer are patterned in accordance with a location for the trench. The trench is etched in the silicon substrate through the mask layer and the anti-reflective coating layer. The etch chamber is monitored to detect removal of the anti-reflective coating layer. The trench etch process is continued for an over-etch duration after removal of the anti-reflective coating layer.

BRIEF DESCRIPTION OF THE DRAWINGS

The foregoing and other features of the present invention will be apparent from the following more particular description of the invention as illustrated in the accompanying drawings, in which like reference characters refer to the same parts throughout the different figures and text. The drawings are not necessarily to scale, emphasis instead being placed upon illustrating the principles of the invention.

DETAILED DESCRIPTION OF THE INVENTION

Before describing in detail the particular shallow trench isolation formation process in accordance with the present invention, it should be observed that the present invention resides in a novel and non-obvious combination of elements and process steps. Accordingly, the elements and process steps have been represented by conventional elements in the drawings, showing only those specific details that are pertinent to the present invention so as not to obscure the disclosure with details that will be readily apparent to those skilled in the art having the benefit of the description herein.

Figure 7:
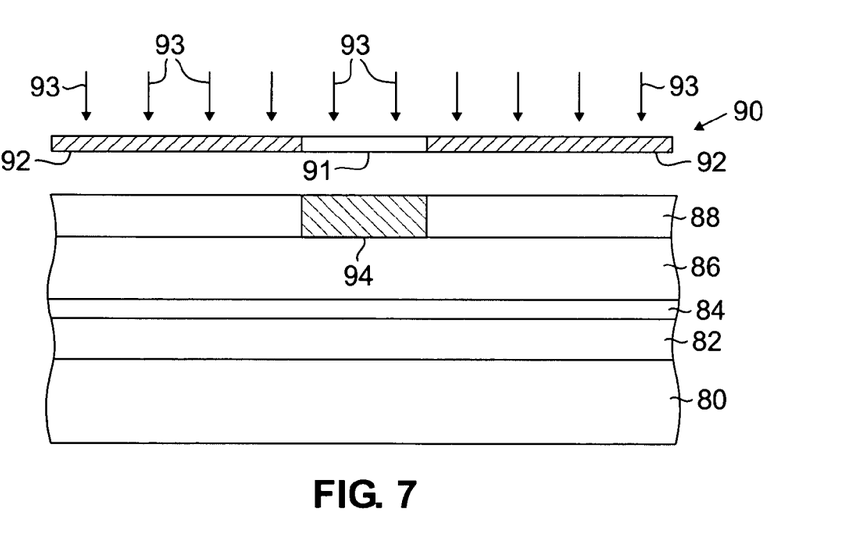
FIGS. 7–11 are cross-sectional views illustrating the formation of a shallow trench isolation feature according to one embodiment of the teachings of the present invention.

FIG. 7 illustrates a process for forming a shallow trench isolation feature according to the teachings of the present invention. A silicon substrate 80 comprises a plurality of active semiconductor devices (not shown). A silicon dioxide layer 82 (or pad oxide) is formed over the substrate 80 followed by formation of a hard mask layer 84. These layers are conventionally used in CMOS twin-well processes to mask regions of the substrate during ion implantation so that doped areas are formed in the non-masked substrate regions.

The hard mask layer 84, also referred to as a tri-level resist layer, incorporates a "hard" layer between two resist layers. A material of the hard layer of the hard mask layer 84 comprises a deposited layer of silicon dioxide, silicon-nitride or other developer-resistant material. The three constituent layers of the hard mask layer 84 are not illustrated in FIG. 7.

Next a dielectric anti-reflective coating layer 86 (DARC) is formed, conventionally using a plasma enhanced chemical vapor deposition (PECVD) process, overlying the silicon nitride layer 84. An anti-reflective coating layer can be interposed between a photoresist layer and an underlying material layer to reduce reflection and scattering from the material layer during the photoresist exposure process, thereby improving the imaging of small features in the photoresist layer. The anti-reflective coating layer is commonly used when patterning aluminum, as aluminum exhibits a high reflectivity that can impair the patterning process. As semiconductor device features continue to shrink the use of an anti-reflective coating layer becomes increasingly advantageous with material layers other than aluminum In this example, the anti-reflective coating layer 86 is disposed over the silicon nitride layer 84 to limit reflections and scattering therefrom. As described below, the present invention utilizes the anti-reflective coating layer as a chamber etch rate monitor to achieve end point control for etching STI trenches and other device features.

As an alternative to a DARC material layer, certain processes employ a SPARC material layer, comprising an organic anti-reflective coating material that is spun onto the substrate. The teachings of the present invention are also applicable to these SPARC-based processes.

According to one embodiment of the present invention, a material of the DARC layer 86 comprises three sub-layers of silicon oxynitride ($SiO_xN_y$), each sub-layer having a different oxygen content and thus a different index of refraction. During formation of the DARC layer the chamber oxygen content is varied to produce the three sub-layers. The combination of the index of refraction and thickness of each DARC sub-layer defines the optical path for the electromagnetic radiation that passes through the DARC layer when the photoresist layer is exposed. A combination of sub-layer thickness and index of refraction is chosen so that reflected and scattered radiation from the underlying material layer are cancelled, or at least minimized, by destructive interference at the wavelength of the radiation that exposes the photoresist.

The reflective and refractive characteristics of the material layer below the DARC layer influence selection of the DARC layer material such that the DARC layer can effectively cancel reflection from the underlying layer. For example, a titanium nitride DARC layer is suitable for use with an underlying aluminum layer, and silicon oxynitride is suitable for use with an underlying silicon oxide or silicon nitride layer.

Continuing with the process of the present invention, a photoresist layer 88 is formed over the dielectric anti-reflective coating layer 86. A mask 90 comprising a transparent region 91 and opaque regions 92 is properly aligned with the material stack according to known techniques and exposed by a source of electromagnetic energy, as indicated by arrowheads 93. The energy impinging on the photoresist layer 88 causes a chemical reaction therein, as indicated by an identified region 94.

Figure 8:
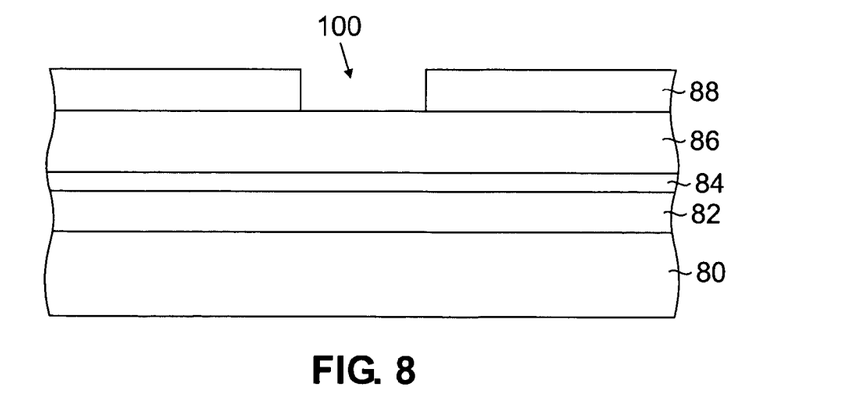

According to this exemplary embodiment, the exposed region 94 is more soluble in a developer solution than the unexposed areas. Thus when exposed to the developer, the region 94 is removed, leaving an opening 100 in the photoresist layer 88. See FIG. 8.

Figure 9:
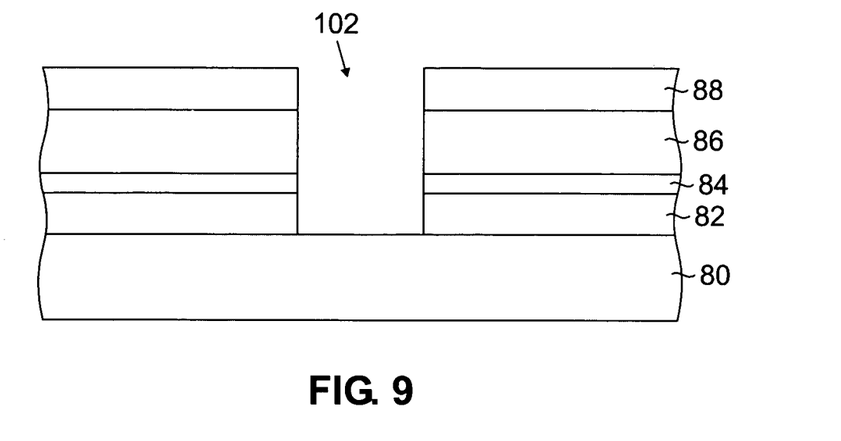
Figure 10:
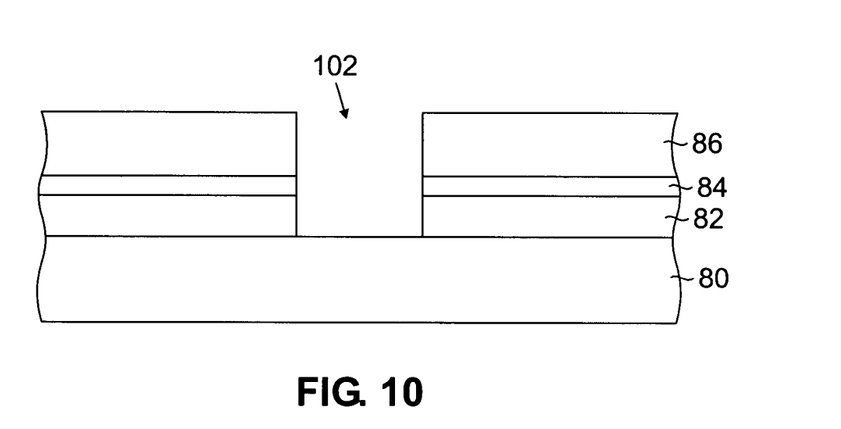

The pattern in the photoresist layer 88 controls etching of the hard mask layer 84, the DARC layer 86 and the silicon dioxide layer 82, by a conventional etching step, using an exemplary etch chemistry of $CF_4/O_2/Ar/CHF_3$. See FIG. 9 where an opening 102 has been formed by the etch process. The photoresist layer 88 is then removed. See FIG. 10.

According to the teachings of the present invention, an etch technique with end point control using the DARC layer 86 is employed to form a shallow trench 104, aligned with the opening 102 (See FIG. 11) in the silicon substrate 80. As a region of the silicon substrate 80 is etched through the opening 102 to form the shallow trench 104, the DARC layer 86 is exposed to the etchant and is also simultaneously removed. According to one embodiment of the inventive process, a plasma etching system is used to etch the shallow trench 104. A suitable recipe for the plasma etch comprises a combination of $CF_4$—He—$C_{12}$—HBr gases.

Figure 11:
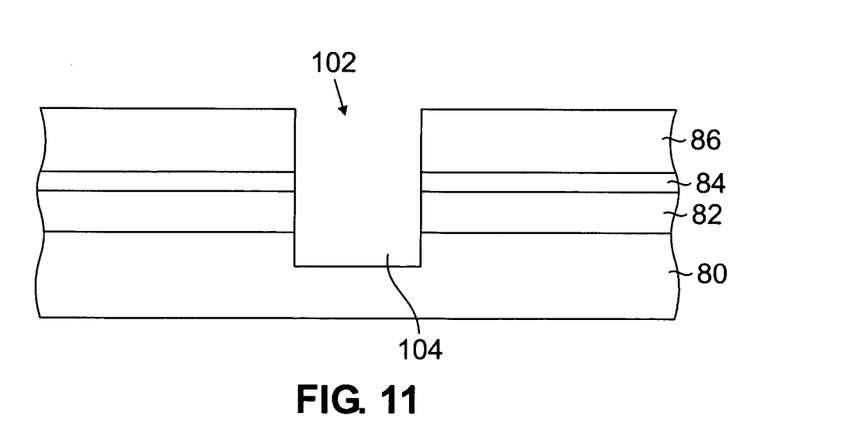

During the etch process, the etch chamber environment is monitored (for example, using plasma emission monitoring) for the material of the DARC layer. In an embodiment utilizing a silicon oxynitride DARC material, a chamber nitrogen content is monitored. When the monitoring indicates that the DARC layer 86 has been removed (as indicated by a drop in the etch chamber nitrogen content), an over-etch time period begins. An empirically determined over-etch factor, which defines the over-etch time period, expresses the relationship between the etch rates (which is equal to the etch duration per thickness of material removed) of the DARC layer material and the silicon. For example, if it has been determined that a 40 percent over-etch forms a trench having the desired depth, the etch process is continued for an additional period equal to 40 percent of the time interval required to remove the DARC layer 86. For a 40 percent over-etch rate and a 40 second DARC layer removal time, the etch process is continued for an additional 16 seconds to achieve the desired shallow trench depth for the trench 104. Alternatively, the etch chamber environment is monitored for the presence of the material of the hard mask layer 84, as this would also indicate that the DARC layer 86 has been substantially removed.

The various etch process factors affecting the shallow trench etch rate through the silicon substrate 80 also affect the DARC layer etch rate due to the similar material composition of the DARC layer 86 and the substrate 80 (i.e., both contain silicon). Thus knowledge of the relationship between these two etch rates provides a mechanism for end-point control of the etch process. By monitoring the etch chamber environment for the material of the DARC layer, the etch process is terminated after the over-etch duration, forming a trench of the desired depth. Thus according to the present invention, the shallow trench etch process is controllable to achieve the desired trench depth.

The correlation between the DARC layer etch rate and the silicon substrate etch rate, as expressed by the over-etch factor, has been empirically determined by subjecting these materials to an etch process (using various etch chemistries) and measuring the resulting trench depth for various DARC layer thicknesses. The over-etch rate can be calculated from this empirical data, the DARC layer thickness, the desired trench depth and the etch chemistry.

Following is an exemplary embodiment illustrating the principles of the present invention. Assume a desired trench depth of 3200 Angstroms. It has been empirically determined that for a particular DARC layer composition and etch chemistry, in 86.9 seconds the DARC layer was removed. This time is referred to as the end point of the DARC etch interval. The etch period was extended for an over-etch duration of 18 seconds, for a total etch duration of 104.9 seconds. During the over-etch time, a trench of approximately of 3100 Angstroms was formed. To compute the DARC layer average etch rate, the total DARC layer thickness (i.e., all three layers of the DARC layer) of approximately 850 Angstroms is divided by the DARC end point of 86.9 seconds to obtain a DARC etch rate of approximately 9.78 Angstroms/min. Using the trench depth of 3100 Angstroms and dividing by the total etch time of 104.9 seconds, yields an average silicon trench etch rate of 29.55 Angstroms/sec. Note that the silicon trench etch rate is approximately three times the DARC layer etch rate. With the known silicon trench etch rate, the etch time to form a 3200 Angstrom trench can be determined, by dividing 3200 Angstroms by 29.55 Angstroms/second. The result is 108.3 seconds. The over-etch duration, i.e., after the DARC end point etch, can be expressed as an over-etch percentage: (108.3−86.9)/86.9=24.6% overetch.

Thus, according to the present invention, an end point detection scheme is taught for shallow trench etching that compensates for chamber-to-chamber and day-to-day etch rate variations. The etch rates are controlled in real time, by monitoring for the DARC layer material in the etch chamber, without the requirement for daily chamber etch depth measurements and the attendant process recipe compensation for variations in chamber-specific etch rates.

In another embodiment, the teachings of the invention can be applied to the formation of a deep trench in the substrate 80, although the over-etch duration would likely be longer than for the formation of a shallow trench.

It is known that when simultaneously etching trenches of different widths, the etch loading effects are uneven and thus the trenches may not etch to the same depth. For a common range of trench widths, ranging from about 0.15 micron to 1 micron, resulting trench depths can vary widely. A dense pattern of wide trenches requires a longer etch duration than a relatively sparse pattern of narrow trenches. The present invention can compensate for such etch loading effects, e.g., trench spacing, trench width and trench density, that are known to affect the trench etch rate. According to the present invention over-etch factors are determined for different trench densities and widths. The appropriate over-etch factor is then employed for etching wafers having similar trench density and trench width characteristics.

Although described in conjunction with etching of a DARC layer, the teachings of the present invention can be adapted for use with other material layers have etch properties that are similar to the etch properties of silicon. That is, the etch process variables that affect etching of the silicon should similarly affect etching of the material layer. Detecting when the material layer has been removed indicates initiation of the over-etch process.

Advantageously, the etching process of the present invention does not require the deposition or the formation of an extra layer during the fabrication process. The DARC layer is thus advantageously employed both to limit reflections from underlying layers during the photoresist exposure process and to serve as a chamber etch end point monitor.

While the invention has been described with reference to preferred embodiments, it will be understood by those skilled in the art that various changes may be made and equivalent elements may be substituted for elements thereof without departing from the scope of the present invention. The scope of the present invention further includes any combination of the elements from the various embodiments set forth herein. In addition, modifications may be made to adapt a particular situation to the teachings of the present invention without departing from its essential scope. Therefore, it is intended that the invention not be limited to the particular embodiment disclosed as the best mode contemplated for carrying out this invention, but that the invention will include all embodiments falling within the scope of the appended claims.

What is claimed is:

1. A method for detecting an end point of a silicon etch process performed in an etch chamber, comprising:
   providing a silicon substrate;
   forming a stack of one or more material layers over the silicon substrate, wherein an upper layer of the stack comprises an anti-reflective coating layer;
   etching a region of the anti-reflective coating layer to form an opening in the region;
   etching the silicon substrate by action of an etchant according to the opening in the anti-reflective coating layer to form a structure in the silicon substrate; wherein during the step of etching the silicon substrate the anti-reflective coating layer is exposed to the etching causing etching of the anti-reflective coating layer; and
   monitoring an etch chamber environment to determine when the anti-reflective coating layer has been substantially removed by the etchant, wherein the end point is responsive to the monitoring step.

2. The method of claim 1 wherein a material of the anti-reflective coating layer comprises a dielectric.

3. The method of claim 1 wherein a material of the anti-reflective coating layer comprises an organic material.

4. The method of claim 1 wherein a material of the anti-reflective coating layer comprises silicon oxynitride.

5. The method of claim 1 wherein the structure comprises a trench.

6. The method of claim 1 wherein the end point is further responsive to a thickness of the anti-reflective coating layer, a structure depth, and a relationship between a silicon substrate etch rate and an anti-reflective coating layer etch race.

7. The method of claim 6 wherein the step of etching the upper surface and the silicon substrate is extended for an over-etch interval after the anti-reflective coating layer has been substantially removed, wherein the over-etch interval is responsive to an anti-reflective coating layer thickness, a structure depth, and a difference between the silicon substrate etch rate and the anti-reflective coating layer etch rate.

8. The method of claim 1 wherein an anti-reflective coating layer etch rate may differ from a silicon substrate etch rate during the step of etching the upper surface and the silicon substrate.

9. The method of claim 1 wherein the step of monitoring further comprises monitoring the etch chamber environment to detect a material of the anti-reflective coating layer, and wherein when the material is no longer detected the anti-reflective coating layer has been substantially removed.

10. The method of claim 1 wherein the stack of one or more material layers comprises a silicon dioxide layer, a hard mask layer, the anti-reflective coating layer and a photoresist layer.

11. The method of claim 10 wherein the hard mask layer comprises one of silicon nitride and silicon dioxide.

12. The method of claim 10 wherein the step of etching the anti-reflective coating layer to form an opening therein comprises:
   patterning the photoresist layer to form a photoresist opening therein;
   etching the silicon dioxide layer, the hard mask layer and the anti-reflective coating layer to form an opening therein according to the photoresist opening; and
   removing the photoresist layer.

13. A method for controlling a silicon etch process performed in an etch chamber, comprising:
   providing a silicon substrate;
   forming a material layer over the silicon substrate;
   forming an anti-reflective coating layer over the material layer;
   patterning the anti-reflective coating layer and the material layer;
   etching a structure in the silicon substrate according to a pattern in the anti-reflective coating layer and the material layer, wherein the anti-reflective coating layer is removed during the etching step;
   monitoring an etch chamber environment to detect a material of the material layer; and
   controlling the etching step in response to the monitoring step.

14. The method of claim 13 further comprising determining a relationship between a silicon substrate etch rate and an anti-reflective coating layer etch rate, and wherein the step of controlling the etching step is responsive to the relationship and to the monitoring step.

15. The method of claim 14 further comprising determining a thickness of the anti-reflective coating layer and a structure depth.

16. The method of claim 15 wherein the step of controlling the etching step further comprises continuing the etching step for an over-etch interval in response to the thickness of the anti-reflective coating layer; the structure depth, and the relationship between the silicon substrate etch rate and the anti-reflective coating layer etch rate.

17. A method for forming an isolation trench in a silicon substrate, comprising:
   providing a silicon substrate;
   forming a stack of one or more material layers over the silicon substrate, wherein one layer of the stack comprises an anti-reflective coating material;
   patterning the anti-reflective coating material;
   etching to form the isolation trench in the silicon substrate according to a pattern in the anti-reflective coating material, wherein the etching step also removes the anti-reflective coating material;
   monitoring the etch environment to detect the anti-reflective coating material during the etching step; and
   controlling a duration of the etching step in response to the monitoring step to form the isolation trench of a desired depth.

18. The method of claim 17 wherein the step of controlling the duration further comprises continuing the etching step for an over-etch interval in response to a thickness of the anti-reflective coating material, the desired depth, and a relationship between a silicon substrate etch rate and an anti-reflective coating layer etch rate.

19. The method of claim 17 wherein the step of controlling the duration further comprises continuing the etching step for an over-etch interval after the monitoring step does nor detect the anti-reflective coating material in the etch environment.

20. The method of claim 19 wherein the over-etch interval is responsive to a relationship between a silicon substrate etch rate and an anti-reflective coating layer etch rate.

21. A method for etching a trench in a semiconductor silicon substrate, wherein the etch process is performed in an etch chamber, the method comprising:
   forming a mask layer;
   forming an anti-reflective coating layer overlying the mask layer;
   patterning the anti-reflective coating layer and the mask layer in accordance with a location for the trench;
   etching a trench in the silicon substrate through the patterned anti-reflective coating layer and the patterned mask layer;
   monitoring an etch chamber environment to detect removal of the aim-reflective coating layer during the step of etching the trench; and
   continuing to etch the trench for an over-etch duration after removal of the anti-reflective coating layer.

22. The method of claim 21 wherein the over-etch duration is responsive to a thickness of the anti-reflective coating material, a trench depth, and a relationship between the silicon substrate etch rate and the anti-reflective coating layer etch rate.

* * * * *